(12) United States Patent
Huang et al.

(10) Patent No.: US 10,312,408 B2
(45) Date of Patent: Jun. 4, 2019

(54) LIGHT EMITTING DIODE CHIP SCALE PACKAGING STRUCTURE AND DIRECT TYPE BACKLIGHT MODULE

(71) Applicant: Lextar Electronics Corporation, Hsinchu (TW)

(72) Inventors: Che-Hsuan Huang, Taoyuan (TW);
Hsin-Lun Su, Chiayi County (TW);
Shu-Hsiu Chang, Taoyuan (TW);
Chih-Hao Lin, Taipei (TW);
Tzong-Liang Tsai, Taichung (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 59 days.

(21) Appl. No.: 15/722,368

(22) Filed: Oct. 2, 2017

(65) Prior Publication Data

US 2018/0102459 A1   Apr. 12, 2018

(30) Foreign Application Priority Data

Oct. 6, 2016   (TW) .............................. 105132374 A

(51) Int. Cl.
| | |
|---|---|
| *H01L 33/08* | (2010.01) |
| *H01L 33/50* | (2010.01) |
| *H01L 33/56* | (2010.01) |

(52) U.S. Cl.
CPC .............. *H01L 33/08* (2013.01); *H01L 33/50* (2013.01); *H01L 33/56* (2013.01); *H01L 2933/0091* (2013.01)

(58) Field of Classification Search
CPC ......... H01L 33/08; H01L 33/50; H01L 33/56; H01L 2933/0091
See application file for complete search history.

(56) References Cited

U.S. PATENT DOCUMENTS

| 8,283,845 B2 | 10/2012 | Itou et al. |
| 8,368,097 B2 | 2/2013 | Kim et al. |
| (Continued) | | |

FOREIGN PATENT DOCUMENTS

| CN | 101647316 A | 2/2010 |
| CN | 201526868 U | 7/2010 |
| (Continued) | | |

OTHER PUBLICATIONS

TIPO Office Action dated Apr. 19, 2017 in corresponding Taiwan application (No. 105132374).

*Primary Examiner* — Yasser A Abdelaziez
(74) *Attorney, Agent, or Firm* — McClure, Qualey & Rodack, LLP

(57) ABSTRACT

A light emitting diode chip scale packaging structure and a direct type backlight module are disclosed. The light emitting diode chip scale packaging structure includes a light emitting diode chip, a wavelength converting layer, a diffusion structure and a lens. The wavelength converting layer is disposed on the light emitting diode chip and directly contacting the light emitting diode chip, and the wavelength converting layer includes phosphor powders. The diffusion structure covers the light emitting diode chip and the wavelength converting layer, a ratio of a height of the diffusion structure to a width of the diffusion structure is 1:2 to 5:4, and the lens covers the diffusion structure. An outer surface of the lens is a free-form surface, and a material of the lens is different from a material of the diffusion structure.

16 Claims, 5 Drawing Sheets

(56) References Cited

U.S. PATENT DOCUMENTS

| | | | |
|---|---|---|---|
| 9,000,461 B2 | 4/2015 | Han et al. | |
| 9,006,775 B1 | 4/2015 | Kuo | |
| 9,206,955 B2 | 12/2015 | Yu et al. | |
| 2014/0306245 A1* | 10/2014 | Hayashi | H01L 33/62 |
| | | | 257/88 |
| 2014/0374779 A1 | 12/2014 | Chung et al. | |
| 2015/0036353 A1* | 2/2015 | Kim | F21K 9/60 |
| | | | 362/311.02 |
| 2016/0138774 A1* | 5/2016 | Joo | H01L 33/58 |
| | | | 362/84 |
| 2017/0082896 A1* | 3/2017 | Jang | G09F 9/33 |
| 2017/0294562 A1* | 10/2017 | Tsuji | H01L 33/54 |

FOREIGN PATENT DOCUMENTS

| | | |
|---|---|---|
| TW | 201308674 A | 2/2013 |
| TW | 201324870 A | 6/2013 |
| TW | 201501360 A | 1/2015 |
| TW | 201506508 A | 2/2015 |
| TW | 201517301 A | 5/2015 |

\* cited by examiner

LIGHT EMITTING DIODE CHIP SCALE PACKAGING STRUCTURE AND DIRECT TYPE BACKLIGHT MODULE

BACKGROUND

This application claims the benefit of Taiwan application Serial No. 105132374, filed Oct. 6, 2016, the subject matter of which is incorporated herein by reference.

TECHNICAL FIELD

The disclosure relates to a light emitting diode packaging structure and a direct type backlight module including the same, and more particularly to a light emitting diode packaging structure having a lens and a direct type backlight module including the same.

DESCRIPTION OF THE RELATED ART

Due to advantages of long lifetime, small volume, great resistance to vibration, low heat emission, and low power consumption, light emitting diodes (LEDs) have been extensively applied in various home appliances and instruments as indicators or light sources. With recent development towards multicolor and high illumination, the applications of the LEDs are extended to various display devices, lighting devices, etc.

A displaying effect of a product would be affected by a luminescence property of a device.

For example, a liquid crystal display device may use a back light module. A direct type back light module may use a light emitting diode as a light source together with a lens.

A scheme of a direct type light emitting module uses a reflective lens, which can lead the majority of a light from a light emitting diode toward a bottom surface of a module with having a larger light-mixing pathway. This scheme can achieve a thinner design. However, a manufacturing process for the device often requires a high accuracy and relates to a pack plate design for a module, with high technical difficulty. In addition, a tolerance for an optical shift is low. Therefore, there are the problems of risk of disposing an element and cost needed to be overcome.

Another scheme of the direct type light emitting uses a refractive lens, which can directly lead a light from a light emitting diode as a light source to a plane to be imaged by the lens. The scheme using the reflective lens has a larger manufacturing tolerance. However, it is very difficult to achieve a thin product when using the refractive lens with limitation of its physical threshold. Moreover, there is an undesirable optical phenomenon resulted from a shift of disposing an element during assembling a whole module, which relates to an accuracy problem of the disposing step.

SUMMARY

The present disclosure provides a light emitting diode chip scale packaging structure and a direct type backlight module including the same. The light emitting diode packaging structure can provide excellent luminous efficiency and display effect.

According to an embodiment of the present disclosure, a light emitting diode chip scale packaging structure is provided. The light emitting diode chip scale packaging structure includes a light emitting diode chip, a wavelength converting layer, a diffusion structure and a lens. The wavelength converting layer is disposed on the light emitting diode chip and directly contacting the light emitting diode chip, and the wavelength converting layer includes phosphor powders. The diffusion structure covers the light emitting diode chip and the wavelength converting layer, a ratio of a height of the diffusion structure to a width of the diffusion structure is 1:2 to 5:4, and the lens covers the diffusion structure. An outer surface of the lens is a free-form surface, and a material of the lens is different from a material of the diffusion structure. A curve of the outer surface of the lens in a cross-sectional view substantially complies with a polynomial of:

$$Z=\Sigma_{i=0}^{n} a_i * y^i$$

a center point of the curve corresponding to the light emitting diode chip is a zero point of y-z coordinate axes, z is a variable of a vertical axis of the curve, y is a variable of a horizontal axis of the curve, $a_i$ is a constant coefficient in a term of $i^{th}$ degree, and $3<n\leq 6$, wherein the diffusion structure includes an encapsulant and a plurality of first diffusion particles doped in the encapsulant, the first diffusion particles include polystyrene (PS), poly-methyl methacrylate (PMMA), polycarbonate (PC), titanium oxide, silicon oxide, aluminum oxide, zirconium oxide, or combinations thereof, a particle size of the first diffusion particles is equal to or less than 50 nm, the lens has a first refractive index, the diffusion structure has a second refractive index, and the second refractive index is larger than the first refractive index by at least 0.2.

Figure 1:
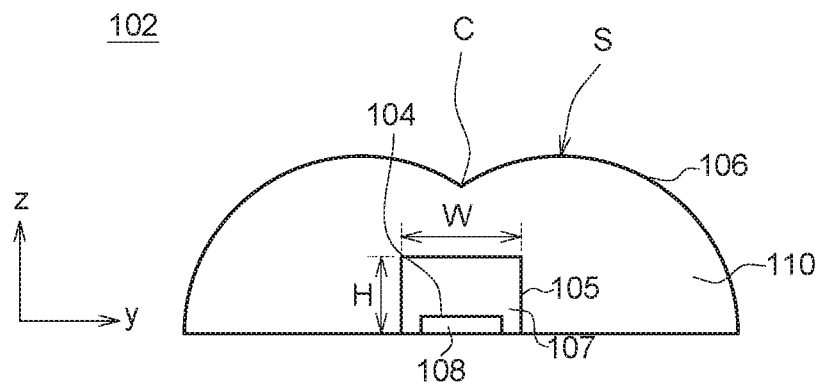
FIG. 1 shows a cross-sectional view of a light emitting diode packaging structure according to an embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

The present disclosure provides a light emitting diode chip scale packaging structure and a direct type backlight module including the same. The light emitting diode packaging structure can provide excellent luminous efficiency and display effect.

Embodiments are provided hereinafter with reference to the accompanying drawings for describing the related configurations. It is noted that not all embodiments of the invention are shown. The identical and/or similar elements of the embodiments are designated with the same and/or similar reference numerals. Also, it is noted that there may be other embodiments of the present disclosure which are not specifically illustrated. Modifications and variations can be made without departing from the spirit of the disclosure to meet the requirements of the practical applications. It is also important to point out that the illustrations may not be necessarily drawn to scale. Thus, the specification and the drawings are to be regarded as an illustrative sense rather than a restrictive sense.

FIG. 1 shows a cross-sectional view of a light emitting diode packaging structure according to an embodiment. As shown in FIG. 1, the light emitting diode chip scale packaging structure 102 includes a light emitting unit 104, a diffusion structure 105 and a lens 106. The diffusion structure 105 covers the light emitting unit 104, and the lens 106 covers the diffusion structure 105. An outer surface S of the lens 106 is a free-form surface, and a material of the lens 106 is different from a material of the diffusion structure 105. In the embodiment, the light emitting unit 104 includes a light emitting diode chip 108, and the diffusion structure 105 covers the light emitting diode chip 108.

In the embodiment, the lens 106 has a first refractive index, the diffusion structure 105 has a second refractive index, and the second refractive index is larger than the first refractive index. The refractive index of the diffusion structure 105 (i.e. the second refractive index) is larger than the refractive index of the lens 106 (i.e. the first refractive index), such that the effect of light diffusion is enhanced, and thus the light emitting angle is increased.

In some embodiments, the difference between the second refractive index and the first refractive index is 0.2 or higher. In some embodiments, the difference between the second refractive index and the first refractive index is preferably 0.3 or higher. In some embodiments, the first refractive index is such as 1.2 to 1.8, and the second refractive index is such as 1.6 to 2.5.

In the embodiment, as shown in FIG. 1, the diffusion structure 105 is in contact with the light emitting unit 104, for example, there is no air gap is between the diffusion structure 105 and the light emitting unit 104. Compared to the situation where there is air between the diffusion structure 105 and the light emitting unit 104, wherein lights passing through the air and reaching the surface of the lens are easily reflected back to the light emitting unit or to the substrate and thereby causing loss of lights; according to the embodiments of the present disclosure, there is no air gap between the diffusion structure 105 and the light emitting unit 104, such that the loss of lights can be prevented, and thus the efficiency of light usage can be further enhanced.

In the embodiment, as shown in FIG. 1, the lens 106 is in contact with the diffusion structure 105, for example, there is no air gap between the lens 106 and the diffusion structure 105. In the embodiment, the interface between the diffusion structure 105 and the lens 106 is such as a free-form surface; that is, the outer surface of the diffusion structure 105 is also a free-form surface. The diffusion structure 105 together with the lens 106 form the light emitting diode packaging structure 102 having double free-form surfaces.

In the embodiment, as shown in FIG. 1, a ratio of a height H of the diffusion structure 105 to a width W of the diffusion structure 105 is such as 1:2 to 5:4.

In some embodiments, as shown in FIG. 1, the diffusion structure may include an encapsulant 107 and a plurality of first diffusion particles (not shown in drawings) doped in the encapsulant 107. For example, the encapsulant 107 that the diffusion structure 105 consists of is in contact with the light emitting diode chip 108. Alternatively, there is no air gap between the encapsulant 107 and the light emitting diode chip 108. In the present embodiment, there is no additional air gap between the light emitting unit 104 and the encapsulant 107 which forms the diffusion structure 105, and thus the structure can have a small thickness, which facilitates miniaturizing or thinning designs as applied to a device such as a direct type back light module.

In some embodiments, the first diffusion particles may include polystyrene (PS), poly-methyl methacrylate (PMMA), polycarbonate (PC), titanium oxide, silicon oxide, aluminum oxide, zirconium oxide, or combinations thereof. In some embodiments, the particle size of the first diffusion particles is such as 50 nm or smaller.

In some embodiments, as shown in FIG. 1, the lens 106 may include a packaging encapsulant 110 and a plurality of second diffusion particles (not shown in drawings) doped in the packaging encapsulant 110. For example, the packaging encapsulant 110 that the lens 106 consists of is in contact with the encapsulant 107 that the diffusion structure 105 consists of. Alternatively, there is no air gap between the packaging encapsulant 110 and the encapsulant 107. In the present embodiment, there is no additional air gap between the packaging encapsulant 110 and the encapsulant 107 which forms the diffusion structure 105, and thus the structure can have a small thickness, which facilitates miniaturizing or thinning designs as applied to a device such as a direct type back light module.

In some embodiments, the second diffusion particles may include titanium oxide, silicon oxide, or the combination thereof.

In some embodiments, the materials of the packaging encapsulant 110 and the encapsulant 107 may include such as silicon gel or transparent resin, such as epoxy resin.

In some embodiments, a curve of an outer surface S of the lens 106 in the cross-section view complies with (or substantially complies with) a polynomial (I) of:

$$Z=\Sigma_{i=0}^{n}a_{i}*y^{i} \quad (I)$$

A center point C of the curve corresponding to the light emitting diode chip 108 is a zero point of y-z coordinate axes. z is a variable of a vertical axis of the curve of the outer surface S in the cross-sectional view. y is a variable of a horizontal axis of the curve of the outer surface S in the cross-sectional view. $a_i$ is a constant coefficient in a term of ith degree in the polynomial (I). In embodiments, in the polynomial (I), n>3, and/or n≤6. In other words, the polynomial (I) has a degree of at least 4. In the present disclosure, the description that the curve "substantially complies with" the polynomial (I) means a correlation coefficient calculated from fitting the curve to the polynomial (I) is larger than or equal to 0.995 (i.e. 0.995–1). In other words, in the present disclosure, the description that the curve "complies with" the polynomial (I) means the correlation coefficient calculated from fitting the curve to the polynomial (I) is 1.

In some embodiments, in the polynomial (I), n=6, $a_6 \neq 0$, and in other words the polynomial (I) has the degree of 6. For example, n=6, $a_0$ is a non-zero constant, $a_1$ is a non-zero constant, $a_2$ is a non-zero constant, $a_3$ is a non-zero constant, $a_4$ is a non-zero constant, $a_5$ is a non-zero constant, and $a_6$ is a non-zero constant.

In an embodiment, the curve substantially complies with a polynomial of: the polynomial (I) that the curve complies with (or substantially complies with) is:

$$z = -0.0005y^6 - 0.0059y^5 + 0.0871y^4 - 0.3718y^3 + 0.5658y^2 - 0.0709y + 2.5046.$$

In other words, in the polynomial (I), $n=6$, $a_0=2.5046$, $a_1=-0.0709y$, $a_2=0.5658$, $a_3=-0.3718$, $a_4=0.0871$, $a_5=-0.0059$, and $a_6=-0.0005$.

Slopes of segment curved surfaces may be calculated by an inverse scheme using Snell's law so as to direct a light to designated locations to obtain a designated optical pattern.

In some embodiments, the lens having the outer surface with the curve of which in the cross-sectional view (substantially) complying with the polynomial (I) having the degree of at least 4 is applied for a direct type back light module to direct a light to a desired location precisely such that the device can have an improved display effect. Without being limited thereto, the lens having the outer surface with the curve of which in the cross-sectional view (substantially) complying with the polynomial (I) having the degree of at least 4 may be applied to other kinds of illumination or display devices.

In the embodiment as shown in FIG. 1, the outer surface S (continuous curved surface) of the lens 106 has a concave structure. The center point C of the curve in the cross-sectional view of the outer surface S is the lowest point of the concave structure.

However, the present disclosure is not limited thereto. In some other embodiments, the outer surface of the lens may have a convex structure, and a center point of the curve of the outer surface in the cross-sectional view is the highest point of the convex structure.

In addition, in the embodiments, the lens having the outer surface with the curve of which in the cross-sectional view (substantially) complying with the polynomial (I) having the degree of at least 4 may be applied as a Fresnel lens structure having the same curvature for the outer curved surface so as to reduce a material quantity, a manufacturing cost, a weight, a volume and a thickness for the lens.

Figure 2A:
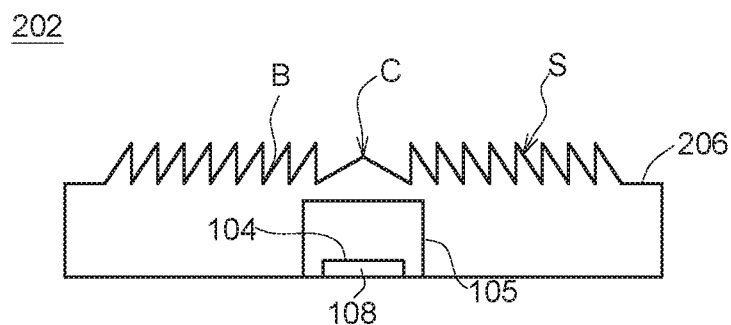
FIG. 2A shows a cross-sectional view of a light emitting diode packaging structure according to another embodiment.
Figure 2B:
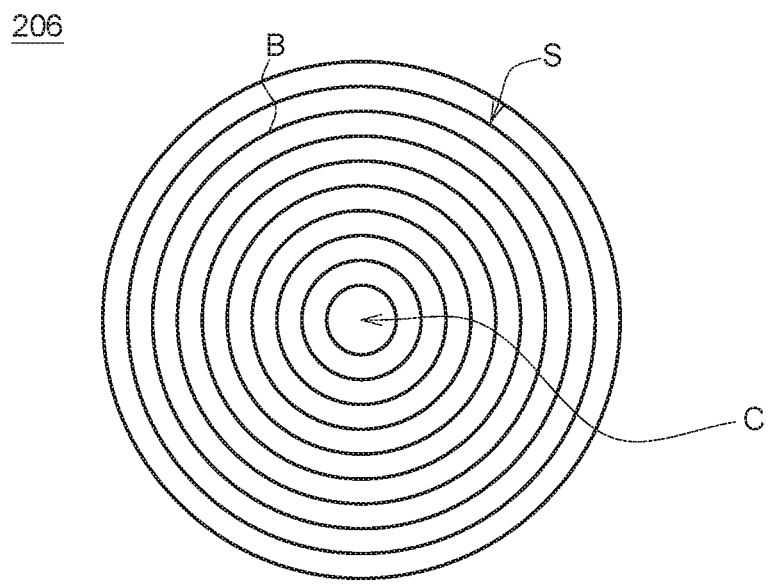
FIG. 2B shows a top view of a lens according to another embodiment.

For example, FIG. 2A and FIG. 2B show a cross-sectional view of a light emitting diode packaging structure 202 and a top view of a lens 206 of the light emitting diode packaging structure 202 respectively according to another embodiment. For example, the light emitting diode packaging structure 202 may be such as a light emitting diode chip scale packaging structure including a light emitting unit 104, a diffusion structure 105 and a lens 206. The diffusion structure 105 covers the light emitting unit 104, and the lens 206 covers the diffusion structure 105. A material of the lens 206 is different from a material of the diffusion structure 105. In the embodiment, the light emitting unit 104 includes a light emitting diode chip 108, and the diffusion structure 105 covers the light emitting diode chip 108.

The light emitting diode packaging structure 202 in FIG. 2A is different from the light emitting diode packaging structure 102 in FIG. 1 in that the outer surface S of the lens 206 has a Fresnel lens structure. A bottom B of the concave portion of the outer surface S of the Fresnel lens structure has a concentric circle texture (FIG. 2B). In addition, the outer surface S of the lens 206 has a convex structure, and the center point C of the curve of the outer surface S in the cross-section view is the highest point of the convex structure.

Figure 3A:
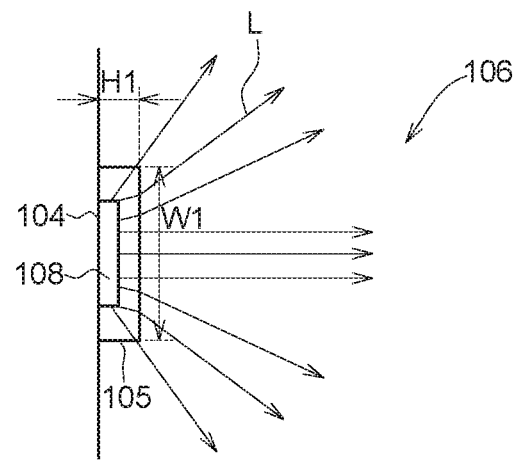
FIG. 3A shows a light path simulation of a light emitting diode packaging structure according to an embodiment.
Figure 3B:
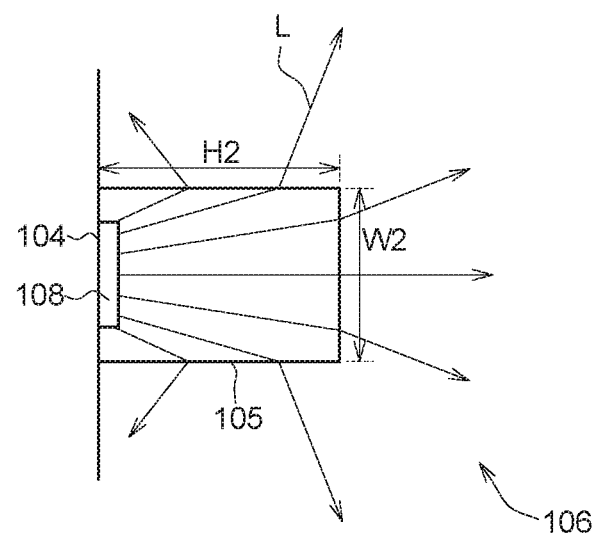
FIG. 3B shows a light path simulation of a light emitting diode packaging structure according to an embodiment.

FIGS. 3A-3B show light path simulations of a light emitting diode packaging structure according to some embodiments. The light path simulations as shown in FIGS. 3A-3B both represent the light path distributions of lights L emitting from the light emitting unit 104 and passing through the diffusion structure 105 followed by entering the lens 106.

In the embodiments, as shown in FIGS. 3A-3B, after the lights L pass through the diffusion structure 105, the lights L both have enlarged light emitting angles after entering the lens 106. The diffusion structure 105 as shown in FIG. 3A has a height H1 and a width W1, the diffusion structure 105 as shown in FIG. 3B has a height H2 and a width W2, the width W1 and the width W2 are substantially the same, and the height H2 is larger than the height H1. As shown in FIGS. 3A-3B, when the height of the diffusion structure 105 is increased, more lights L scatter toward large angles, and less lights emit toward small angles, such that the light emitting angle is enlarged, and the lighting intensity within the large light emitting angle is more uniform.

FIGS. 4-8 show cross-sectional views of light emitting units according to various embodiments.

Figure 4:
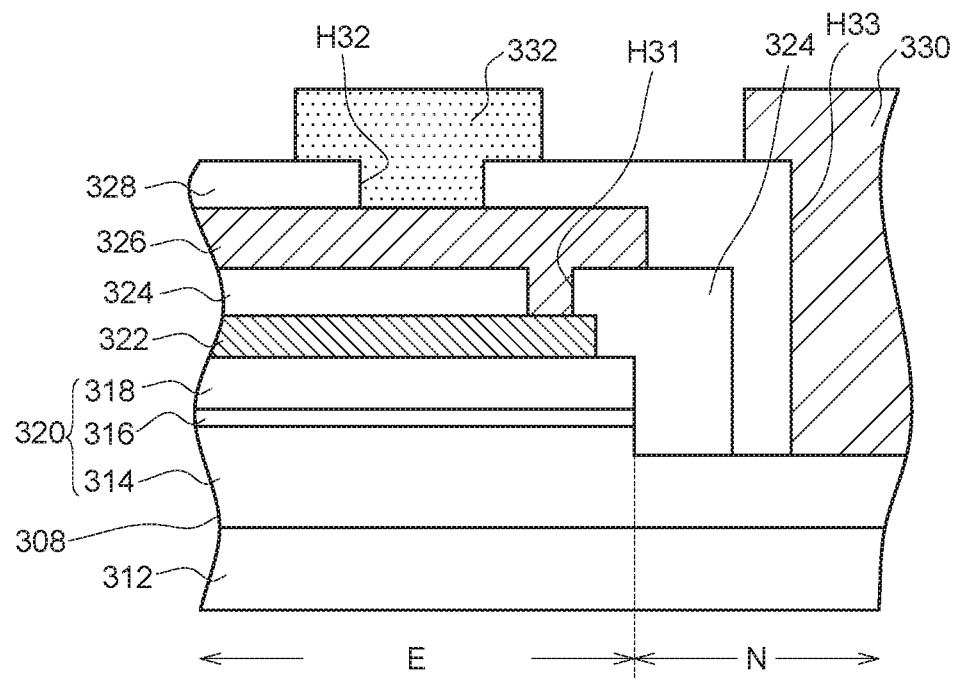
FIG. 4 shows a cross-sectional view of a light emitting unit according to an embodiment.

Referring to FIG. 4, a light emitting unit 304 includes a substrate 312 and a light emitting diode chip 308, such as a LED flip chip, on the substrate 312. The light emitting diode chip 308 includes a first type semiconductor layer 314, an active layer 316 and a second type semiconductor layer 318 stacked on the substrate 312 in sequence. The first type semiconductor layer 314 has a conductivity type of one of an N type conductivity and a P type conductivity, and the second type semiconductor layer 318 has the other conductivity type of the N type conductivity and the P type conductivity. A light emitting diode stack unit 320 consists of the first type semiconductor layer 314, the active layer 316 and the second type semiconductor layer 318 in a light emitting region E. The light emitting diode chip 308 includes a transparent conductive layer 322, and the transparent conductive layer 322 is disposed on the second type semiconductor layer 318 of the light emitting diode stack unit 320. The light emitting diode chip 308 includes a Bragg reflective layer 324, and the Bragg reflective layer 324 is disposed on the transparent conductive layer 322. The Bragg reflective layer 324 has a first through hole H31 exposing the transparent conductive layer 322 on the light emitting diode stack unit 320. The light emitting diode chip 308 includes a metal layer 326, and the metal layer 326 is disposed on the Bragg reflective layer 324 and fills in the first through hole H31 of the Bragg reflective layer 324, such that metal layer 326 penetrating through the first through hole H31 can be connected with the transparent conductive layer 322 on the light emitting diode stack unit 320. The light emitting diode chip 308 includes a protective layer 328, and the protective layer 328 covers the metal layer 326. The protective layer 328 has a second through hole H32 exposing the metal layer 326. The light emitting diode chip 308 includes a first electrode 330, and the first electrode 330 is filled in a third through hole H33 for exposing the first type semiconductor layer 314 in a non-light emitting region N and is connected with the first type semiconductor layer 314. The light emitting diode chip 308 includes a second electrode 332, and the second electrode 332 is filled in the second through hole H32 of the protective layer 328 to be connected with the metal layer 326.

In some embodiments, the aforementioned diffusion structure 105 covers the light emitting diode chip 308 (LED flip chip) of the light emitting unit 304, and the lens as described in previous embodiments (such as the lens 106 of FIG. 1, the lens 206 of FIGS. 2A-2B, or a lens of another kind not shown but (substantially) complying with the polynomial (I) having the degree of at least 4) covers on the diffusion structure 105, so as to form a light emitting diode (chip scale) packaging structure of the embodiments of the present disclosure.

Figure 5:
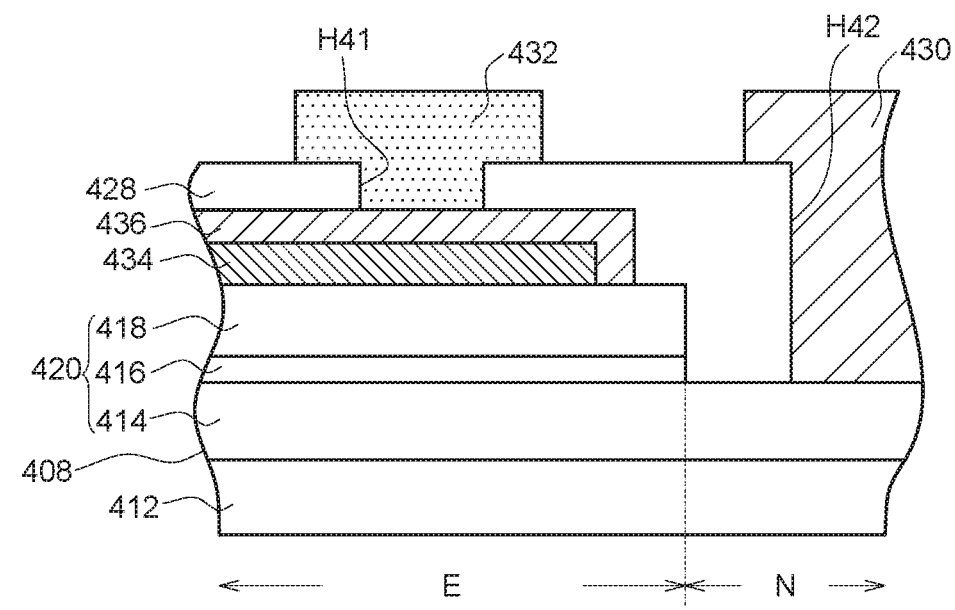
FIG. 5 shows a cross-sectional view of a light emitting unit according to an embodiment.

Referring to FIG. 5, a light emitting unit 404 includes a substrate 412 and a light emitting diode chip 408 such as a LED flip chip on the substrate 412. The light emitting diode chip 408 includes a first type semiconductor layer 414, an active layer 416 and a second type semiconductor layer 418 stacked on the substrate 412 in sequence. The first type semiconductor layer 414 has a conductivity type of one of the N type conductivity and the P type conductivity, and the second type semiconductor layer 418 has the other conductivity type of the N type conductivity and the P type conductivity. A light emitting diode stack unit 420 consists of the first type semiconductor layer 414, the active layer 416 and the second type semiconductor layer 418 in the light emitting region E. The light emitting diode chip 408 includes a reflective ohmic conductive layer 434, and the reflective ohmic conductive layer 434 is disposed on the second type semiconductor layer 418 of the light emitting diode stack unit 420. In an embodiment, the reflective ohmic conductive layer 434 may have a Ni/Ag/Pt alloy structure or a Ni/Al/Ti alloy structure. The light emitting diode chip 408 includes a buffering layer 436, and the buffering layer 436 is disposed on the reflective ohmic conductive layer 434. The light emitting diode chip 408 includes a protective layer 428, and the protective layer 428 covers the buffering layer 436. The protective layer 428 has a first through hole H41 exposing the buffering layer 436. The light emitting diode chip 408 includes a first electrode 430, and the first electrode 430 is filled in a second through hole H42 for exposing the first type semiconductor layer 414 in the non-light emitting region N and is connected with the first type semiconductor layer 414. The light emitting diode chip 408 includes a second electrode 432, and the second electrode 432 is filled in the first through hole H41 of the protective layer 428 to be connected with the buffering layer 436.

In some embodiments, the aforementioned diffusion structure 105 covers the light emitting diode chip 408 (LED flip chip) of the light emitting unit 404, and the lens as described in previous embodiments (such as the lens 106 of FIG. 1, the lens 206 of FIGS. 2A-2B, or a lens of another kind not shown but (substantially) complying with the polynomial (I) having the degree of at least 4) covers on the diffusion structure 105, so as to form a light emitting diode (chip scale) packaging structure of the embodiments of the present disclosure.

Figure 6:
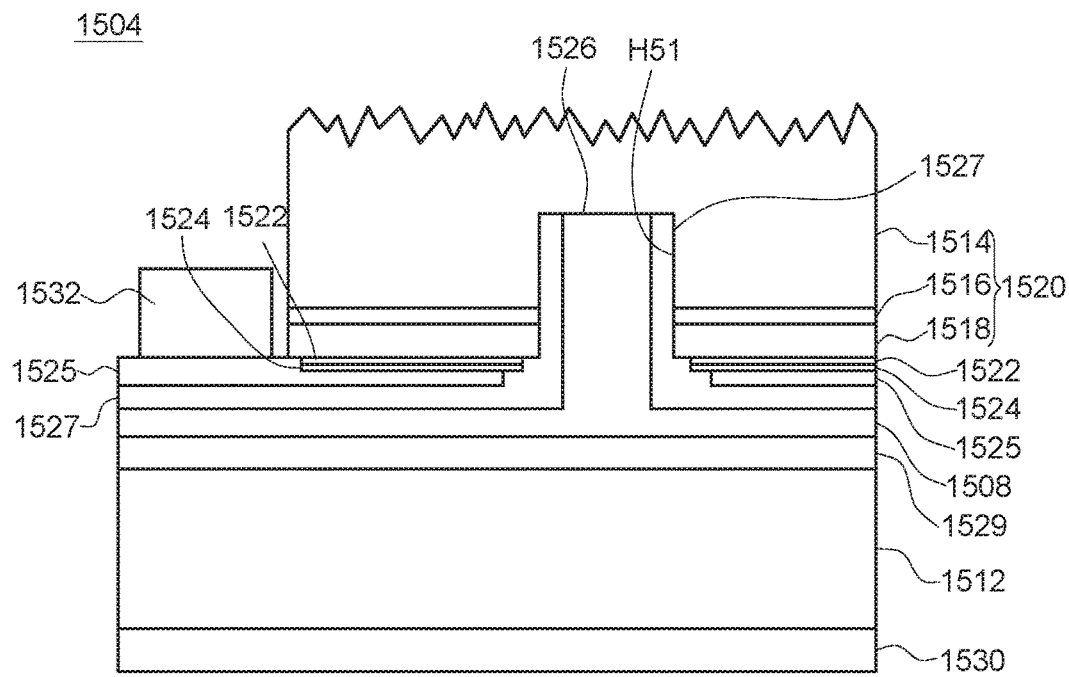
FIG. 6 shows a cross-sectional view of a light emitting unit according to an embodiment.

Referring to FIG. 6, a light emitting unit 1504 includes a substrate 1512 and a light emitting diode chip 1508, such as a vertical LED flip chip, on the substrate 1512. The light emitting diode chip 1508 includes a first type semiconductor layer 1514, an active layer 1516 and a second type semiconductor layer 1518 stacked on the substrate 1512 in sequence. The first type semiconductor layer 1514 has a conductivity type of one of the N type conductivity and the P type conductivity, and the second type semiconductor layer 1518 has the other conductivity type of the N type conductivity and the P type conductivity. A light emitting diode stack unit 1520 consists of the first type semiconductor layer 1514, the active layer 1516 and the second type semiconductor layer 1518 in a light emitting region E. The light emitting diode chip 1508 includes a transparent conductive layer 1522, and the transparent conductive layer 1522 is disposed on the second type semiconductor layer 1518 of the light emitting diode stack unit 1520. The light emitting diode chip 1508 includes a Bragg reflective layer 1524, and the Bragg reflective layer 1524 is disposed on the transparent conductive layer 1522. The light emitting diode chip 1508 includes a diffusion barrier 1525, and the diffusion barrier 1525 is disposed on the Bragg reflective layer 1524. The light emitting diode chip 1508 includes a through hole H51, and the through hole H51 penetrates through the diffusion barrier 1525, the Bragg reflective layer 1524, the transparent conductive layer 1522, the second type semiconductor layer 1528 and the active layer 1516 for exposing the first type semiconductor layer 1514 of the light emitting diode stack unit 1520. The light emitting diode chip 1508 includes a metal layer 1526, and the metal layer 1526 is disposed on the diffusion barrier 1525 and is filled in the through hole H51, such that metal layer 1526 penetrating through the through hole H51 can be connected with the first type semiconductor layer 1514 of the light emitting diode stack unit 1520. The light emitting diode chip 1508 includes a first electrode 1530, and the first electrode 1530 is disposed on the metal layer 1526 and is electrically connected to the first type semiconductor layer 1514 via the metal layer 1526. The light emitting diode chip 1508 includes a second electrode 1532, the diffusion barrier 1525 is disposed on the second electrode 1532, and the second electrode 1532 is electrically connected to the second type semiconductor layer 1518. In the embodiment, the light emitting diode chip 1508 may further include an insulating layer 1527 and a bonding metal layer 1529. The insulating layer 5127 is located on the sidewall of the through hole H51 and located between the diffusion barrier 1525 and the metal layer 1526. The bonding metal layer 1529 is disposed between the substrate 1512 and the metal layer 1526.

In some embodiments, the aforementioned diffusion structure 105 covers the light emitting diode chip 1508 (vertical LED flip chip) of the light emitting unit 1504, and the lens as described in previous embodiments (such as the lens 106 of FIG. 1, the lens 206 of FIGS. 2A-2B, or a lens of another kind not shown but (substantially) complying with the polynomial (I) having the degree of at least 4) covers on the diffusion structure 105, so as to form a light emitting diode (chip scale) packaging structure of the embodiments of the present disclosure.

Figure 7:
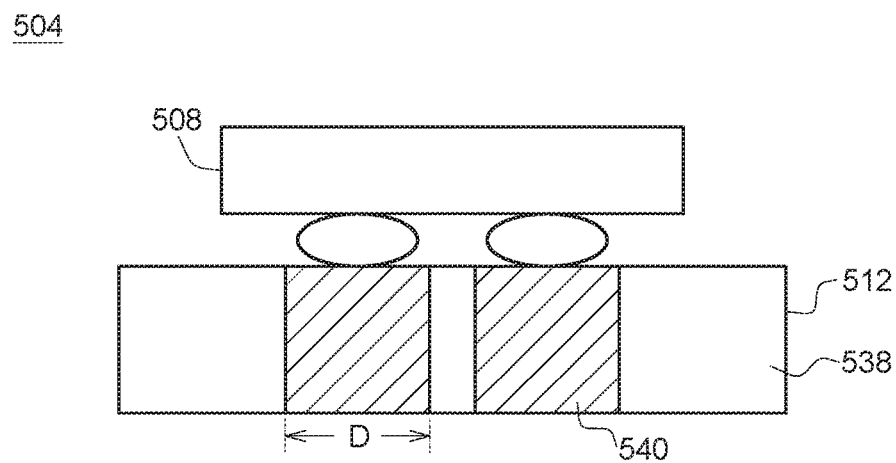
FIG. 7 shows a cross-sectional view of a light emitting unit according to an embodiment.

Referring to FIG. 7, a light emitting unit 504 includes a substrate 512 and a light emitting diode chip 508. The substrate 512 includes an insulating layer 538 and a conductive pillar 540 penetrating through the insulating layer 538. In embodiments, the conductive pillar 540 may have a diameter D of 0.25 mm. The light emitting diode chip 508 is disposed on the substrate 512 by a flip chip method using a solder material and is electrically connected to the conductive pillar 540 of the substrate 512. In embodiments, the light emitting unit 504 of such kind may have an area smaller than 3 mm×3 mm.

In some embodiments, the aforementioned diffusion structure 105 covers the light emitting diode chip 508 of the light emitting unit 504, and the lens as described in previous embodiments (such as the lens 106 of FIG. 1, the lens 206 of FIGS. 2A-2B, or a lens of another kind not shown but (substantially) complying with the polynomial (I) having the degree of at least 4) covers on the diffusion structure 105, so as to form a light emitting diode (chip scale) packaging structure of the embodiments of the present disclosure. In other words, the diffusion structure 105 (or the encapsulant 107) of the light emitting diode packaging structure is in contact with a top surface of the exposed light emitting diode chip 508, and the diffusion structure 105 (or the encapsulant 107) may be in contact with a top surface of the exposed substrate 512 as well. The diffusion structure 105 (or the encapsulant 107) may be in contact with a side surface of an exposed component.

Figure 8:
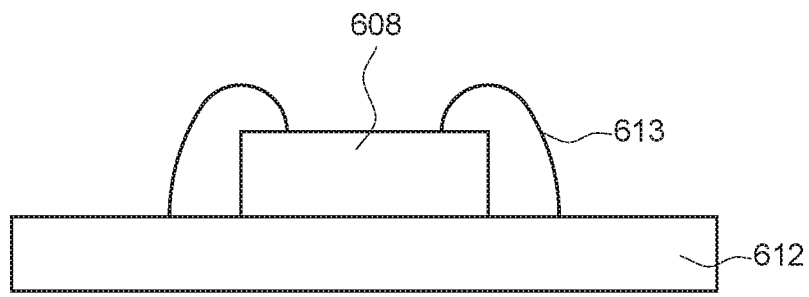
FIG. 8 shows a cross-sectional view of a light emitting unit according to an embodiment.

Referring to FIG. 8, a light emitting unit 604 includes a light emitting diode chip 608 and a substrate 612. The light emitting diode chip 608 on the substrate 612 is electrically connected to the substrate 612 via a bonding wire 613.

In some embodiments, the aforementioned diffusion structure 105 covers the light emitting diode chip 608 of the light emitting unit 604, and the lens as described in previous embodiments (such as the lens 106 of FIG. 1, the lens 206 of FIGS. 2A-2B, or a lens of another kind not shown but (substantially) complying with the polynomial (I) having the degree of at least 4) covers on the diffusion structure 105, so as to form a light emitting diode (chip scale) packaging structure of the embodiments of the present disclosure. In other words, the diffusion structure 105 (or the encapsulant 107) is in contact with a top surface and a side surface of the exposed light emitting diode chip 608 as well as the exposed bonding wire 613. The diffusion structure 105 (or the encapsulant 107) may be in contact with a top surface and a side surface of the exposed substrate 612 as well.

In some embodiments, the light emitting unit of the light emitting diode (chip scale) packaging structure may further include a wavelength converting layer (not shown) disposed on at least a top surface or a side surface of the light emitting diode chip. The wavelength converting layer is capable of being excited by a first light emitted from the light emitting diode chip to emit a second light having a wavelength different from a wavelength of the first light. A color tone of an emitting light of the light emitting diode packaging structure or the light emitting device may be adjusted by the wavelength converting layer. The wavelength converting layer may include a wavelength converting material such as phosphor powders. In some embodiments, the aforementioned diffusion structure 105 (or the encapsulant 107) is in contact with the exposed wavelength converting layer. The wavelength converting layer may have a single-layer structure or a multi-layer structure according to actual demands.

Figure 9:
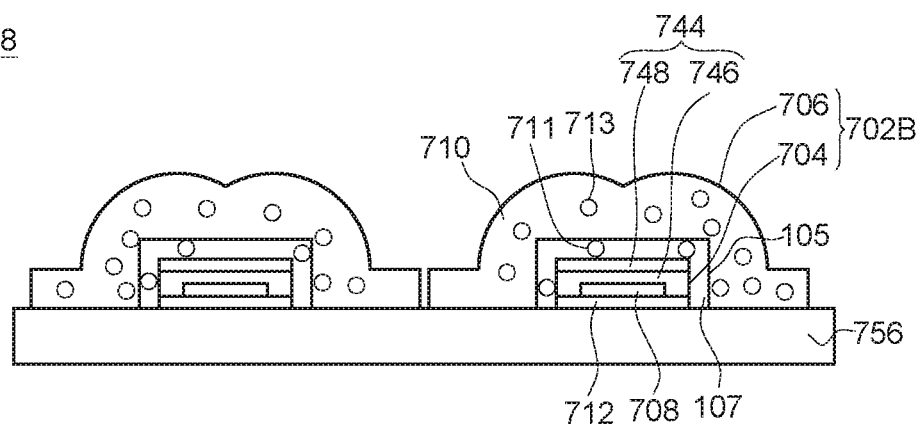
FIG. 9 shows a cross-sectional view of a light emitting device according to an embodiment.

FIG. 9 shows a cross-sectional view of a light emitting device according to an embodiment.

Referring to FIG. 9, the light emitting device 758 includes a circuit board 756 and a plurality of light emitting diode packaging structures 702B. The light emitting diode packaging structures 702B are arranged separately from each other. The light emitting device 758 according to embodiments can be applied for a direct type back light module.

As shown in FIG. 9, light emitting diode chips 708 are disposed on the substrate 712. The diffusion structure 105 covers the light emitting diode chip 708 of a light emitting unit 704, and a lens 706 covers the diffusion structure 105. In the embodiments, the light emitting diode chips 708 may be disposed on the substrate 712 and electrically connected to a conductive portion of the substrate 712 by a flip chip method or a wire bonding method.

As shown in FIG. 9, the light emitting diode packaging structure 702B in includes a wavelength converting layer 744. For example, the wavelength converting layer 744 includes a first wavelength converting layer 746 and a second wavelength converting layer 748. In some embodiments, the wavelength converting layer 744 may include only the first wavelength converting layer 746. As shown in FIG. 9, in the embodiments, the first wavelength converting layer 746 may be formed on a light emitting side of the light emitting diode chips 708, for example, on exposed top surfaces of the light emitting diode chips 708. The first wavelength converting layer 746 may be also formed on exposed side surfaces of the light emitting diode chips 708, and/or filled into an air gap between the light emitting diode chips 708. As shown in FIG. 9, in the embodiments, the second wavelength converting layer 748 is formed on the first wavelength converting layer 746. The first wavelength converting layer 746 and the second wavelength converting layer 748 may have wavelength converting characteristics different from each other.

As shown in FIG. 9, in the embodiments, the diffusion structure 105 may include an encapsulant 107 and first diffusion particles 711 doped in the encapsulant 107.

As shown in FIG. 9, in the embodiments, the lens 706 may include a packaging encapsulant 710 and second diffusion particles 713 doped in the packaging encapsulant 710.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A light emitting diode chip scale packaging structure, comprising:
   a light emitting diode chip;
   a wavelength converting layer disposed on the light emitting diode chip and directly contacting the light emitting diode chip, wherein the wavelength converting layer comprises phosphor powders;
   a diffusion structure covering the light emitting diode chip and the wavelength converting layer, wherein a ratio of a height of the diffusion structure to a width of the diffusion structure is 1:2 to 5:4; and
   a lens covering the diffusion structure, wherein an outer surface of the lens is a free-form surface, a material of the lens is different from a material of the diffusion structure:
   wherein a curve of the outer surface of the lens in a cross-sectional view substantially complies with a polynomial of:

$$Z=\Sigma_{i=0}^{n} a_i * y^i$$

a center point of the curve corresponding to the light emitting diode chip is a zero point of y-z coordinate axes, z is a variable of a vertical axis of the curve, y is a variable of a horizontal axis of the curve, $a_i$ is a constant coefficient in a term of $i^{th}$ degree, and $3 < n \leq 6$, wherein the diffusion structure comprises an encapsulant and a plurality of first diffusion particles doped in the encapsulant, the first diffusion particles comprise polystyrene (PS), poly-methyl methacrylate (PMMA), polycarbonate (PC), titanium oxide, silicon oxide, aluminum oxide, zirconium oxide, or combinations thereof, a particle size of the first diffusion particles is equal to or less than 50 nm, the lens has a first refractive index, the diffusion structure has a second refractive index, and the second refractive index is larger than the first refractive index by at least 0.2.

2. The light emitting diode chip scale packaging structure according to claim 1, wherein the first refractive index is 1.2 to 1.8, and a correlation coefficient calculated from fitting the curve to the polynomial (I) is larger than or equal to 0.995.

3. The light emitting diode chip scale packaging structure according to claim 1, wherein the first refractive index is 1.2 to 1.8, and the second refractive index is 1.6 to 2.5.

4. The light emitting diode chip scale packaging structure according to claim 1, further comprising a lighting emitting unit, wherein the light emitting unit comprises the light emitting diode chip, the diffusion structure is in contact with the light emitting unit, no air gap is between the diffusion structure and the light emitting unit, the lens is in contact with the diffusion structure, and no air gap is between the lens and the diffusion structure.

5. The light emitting diode chip scale packaging structure according to claim 4, wherein the diffusion structure has a free-form surface.

6. The light emitting diode chip scale packaging structure according to claim 1, wherein the lens comprises a packaging encapsulant and a plurality of second diffusion particles doped in the packaging encapsulant, and the second diffusion particles comprise titanium oxide, silicon oxide, or the combination thereof.

7. The light emitting diode chip scale packaging structure according to claim , wherein in the polynomial (I), n=6 and $a_6 \neq 0$.

8. The light emitting diode chip scale packaging structure according to claim 1, wherein in the polynomial (I), n=6, $a_0$ is a non-zero constant, $a_1$ is a non-zero constant, $a_2$ is a non-zero constant, $a_3$ is a non-zero constant, $a_4$ is a non-zero constant, $a_5$ is a non-zero constant, and $a_6$ is a non-zero constant.

9. The light emitting diode chip scale packaging structure according to claim 1, wherein the curve substantially complies with a polynomial of:

$$z=-0.0005y^6-0.0059y^5+0.0871y^4-0.3718y^3+0.5658y^2-0.0709y+2.5046.$$

10. The light emitting diode chip scale packaging structure according to claim 1, wherein the outer surface has a concave structure, and the center point of the curve is the lowest point of the concave structure.

11. The light emitting diode chip scale packaging structure according to claim 1, wherein the outer surface has a convex structure, and a center point of the curve is the highest point of the convex structure.

12. The light emitting diode chip scale packaging structure according to claim 1, wherein the outer surface of the lens has a Fresnel lens structure.

13. The light emitting diode chip scale packaging structure according to claim 1, wherein the lens is a reflective lens or a refractive lens.

14. The light emitting diode chip scale packaging structure according to claim 1, further comprising a substrate, wherein the light emitting diode chip is disposed on the substrate and electrically connected to the substrate by a flip chip method or a wire bonding method.

15. The light emitting diode chip scale packaging structure according to claim 1, wherein the wavelength converting layer comprises a first wavelength converting layer and a second wavelength converting layer, the second wavelength converting layer is formed on the first wavelength converting layer, and the first wavelength converting layer and the second wavelength converting layer have wavelength converting characteristics different from each other.

16. The light emitting diode chip scale packaging structure according to claim 1, wherein the light emitting diode chip is a LED flip chip or a vertical LED flip chip.

* * * * *